United States Patent [19]
Loheac

[11] Patent Number: 5,981,348
[45] Date of Patent: Nov. 9, 1999

[54] METHOD FOR THE MANUFACTURE OF THE EXTRINSIC BASE OF AN NPN TRANSISTOR IN A HIGH-FREQUENCY BIPOLAR TECHNOLOGY

[75] Inventor: Jean-Luc Loheac, Rennes, France

[73] Assignee: SGS-Thomson Microelectronics S.A., Saint Genis, France

[21] Appl. No.: 08/889,490

[22] Filed: Jul. 8, 1997

[30] Foreign Application Priority Data

Jul. 10, 1996 [FR] France ................................. 96 08832

[51] Int. Cl.$^6$ ................................................. H01L 21/331
[52] U.S. Cl. .......................................................... 438/350
[58] Field of Search ................................... 438/350, 400, 438/403, 423, 766, 515, 373, 528, 530

[56] References Cited

U.S. PATENT DOCUMENTS

| | | | |
|---|---|---|---|
| 5,254,484 | 10/1993 | Hefner et al. ........................... | 438/515 |
| 5,489,541 | 2/1996 | Yang et al. . | |
| 5,508,211 | 4/1996 | Yee et al. ................................ | 438/400 |

FOREIGN PATENT DOCUMENTS

A-0 139 130  5/1985  European Pat. Off. ........ H01L 21/00

OTHER PUBLICATIONS

French Search Report from French Patent Application 96 08832, filed Jul. 10, 1996.

IEEE Transactions on Electron Devices, vol. 38, No. 1, Jan. 1, 1991, pp. 107–110, Chantre, A., et al., "Identification of a Corner Tunneling Current Component In Advanced CMOS–Compatible Bipolar Transistors".

IEEE Transcation On Electron Devices, vol. 35, No. 8, Aug. 1988, pp. 1322–1327, Tze–Chiang Chen, et al., "An Advanced Bipolar Transistor With Self-Aligned Ion-Implanted Base and W/Poly Emitter".

*Primary Examiner*—Charles Bowers
*Assistant Examiner*—Craig Thompson
*Attorney, Agent, or Firm*—Wolf, Greenfield & Sacks, P.C.

[57] ABSTRACT

Disclosed is a method for the fabrication of an extrinsic base of an NPN transistor using high frequency bipolar technology. According to the method, using a doping of the extrinsic base of the transistor by ion implantation, the amorphous crystal lattice is recrystallized by very high-speed thermal annealing before the dopants of the extrinsic base are diffused in the epitaxial layer.

3 Claims, 2 Drawing Sheets

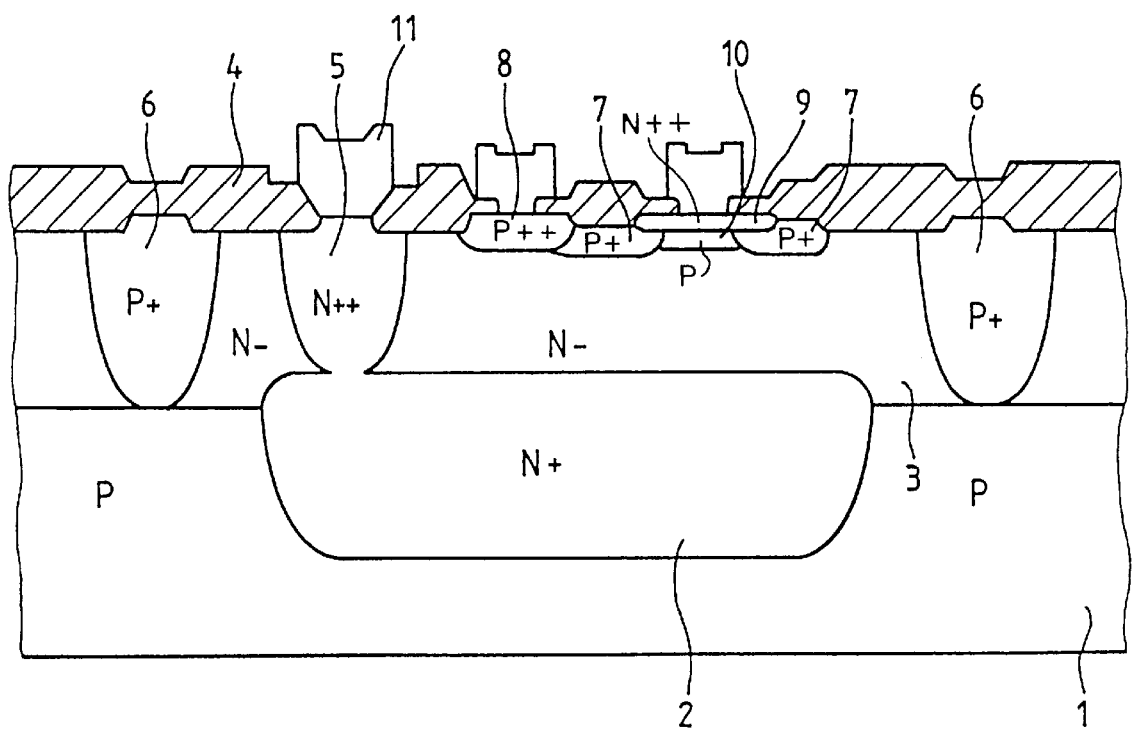
FIG_1
(PRIOR ART)

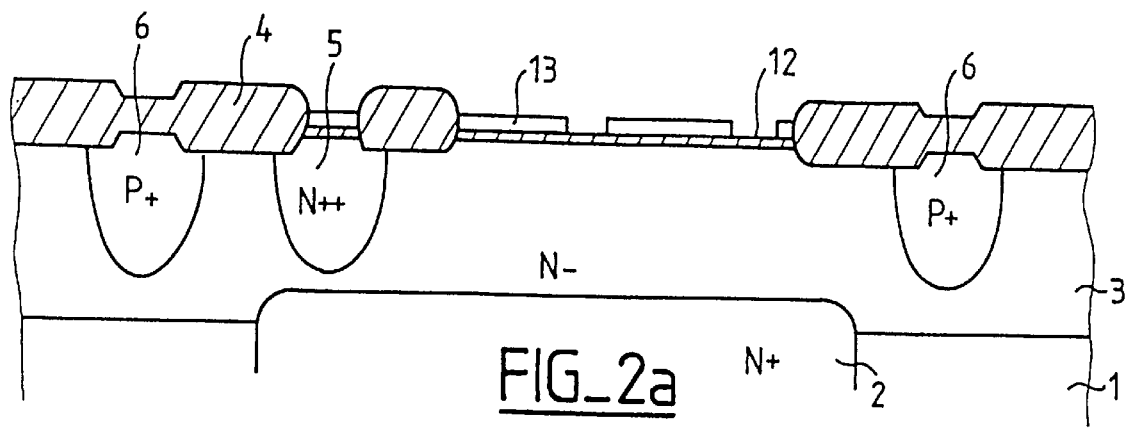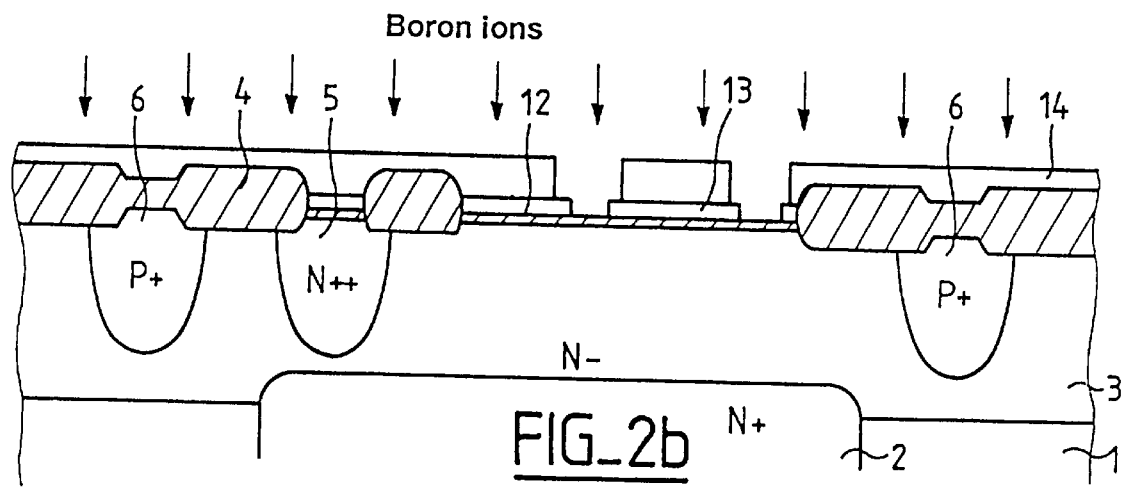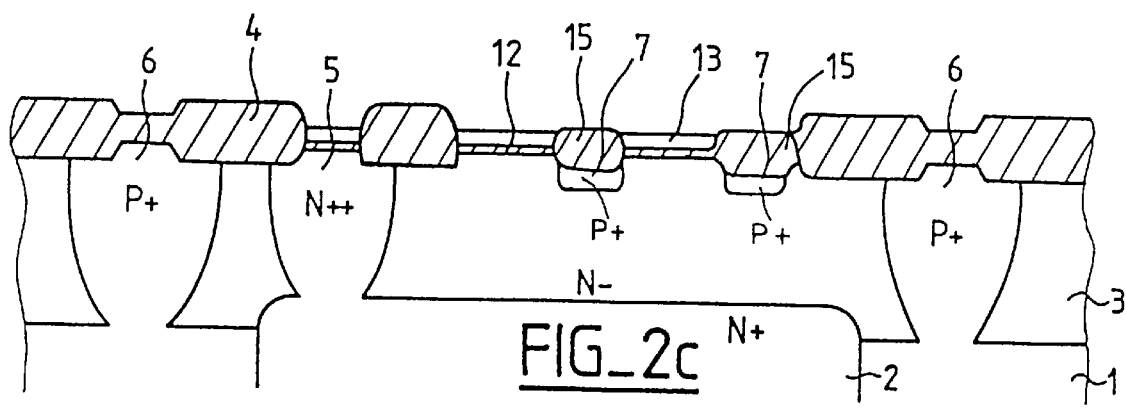

METHOD FOR THE MANUFACTURE OF THE EXTRINSIC BASE OF AN NPN TRANSISTOR IN A HIGH-FREQUENCY BIPOLAR TECHNOLOGY

BACKGROUND OF THE INVENTION

1. Field of the Invention

The present invention relates to the manufacture of high-frequency bipolar integrated circuits and more particularly to the manufacture of the extrinsic base of an NPN transistor in a high-frequency bipolar technology.

2. Discussion of the Related Art

A manufacturing method of high-frequency bipolar integrated circuits combines many steps to be performed in order to make an integrated circuit out of a silicon wafer. Thus, the method includes the steps of doping by ion implantation or by pre-deposition, photolithography, thermal oxidation, epitaxial growth, diffusion and plasma etching or chemical etching.

These methods of manufacture are being constantly improved to increase the density of integration of the integrated circuits as well as their electrical performance characteristics.

One known standard method of manufacture, describing chiefly the steps needed to make an NPN transistor, is described below in reference to FIG. 1. The figure does not, however, show all the cleaning steps which have no effect on the structure of the layers but which are essential to obtain a high manufacturing output.

FIG. 1 shows a sectional view of an NPN transistor, and is labeled to identify the different zones and layers of an NPN transistor made by means of high-frequency bipolar technology. The starting material is a P type semiconductor substrate. The method includes the following steps:

a) the doping of the substrate 1 by ion implantation to form a highly doped N type buried layer 2;

b) epitaxial growth of a weakly doped N type layer 3;

c) post-epitaxial oxidation to form a thin oxide film on the surface of the epitaxial layer followed by the deposition of a silicon nitride film; the oxide film prevents the tensile stress prompted by the nitride film on the epitaxial layer and is also used as a buffer oxide during ion implantation. These two films cannot be seen in FIG. 1 because they are removed at the end of the process;

d) insulation by lateral oxide 4 also called thick LOCOS growth to insulate the components from one another;

e) the creation of a highly doped N type collector well 5 by ion implantation;

f) insulation by anti-channel diffusion, namely the creation of a P type channel 6 under thick oxide 4 by ion implantation to prevent leakage currents between collectors, followed by the diffusion of these channels in the epitaxial layer 3; the diffusion of the collector well is done simultaneously;

g) the definition of so-called active zones in the epitaxial layer 3 by the etching of the silicon nitride layer;

h) the creation of an extrinsic base 7 by the pre-deposition of boron out of boron nitride; the extrinsic base 7 is an active zone of the NPN transistor that sets up the link between an intrinsic base 10 located beneath the emitter zone 9 and a base contact zone 8 connecting the intrinsic base 10 to a first metal layer; the extrinsic base 7 is highly doped in order to reduce the resistance rbb' of the Giacoletto pattern and enable the integrated circuit to work at high frequency; the pre-deposition operation is followed by a step for the diffusion of boron in the epitaxial layer; the step h) will be more particularly described hereinafter in the description;

I) the creation, by ion implantation, of the P type base contact zone 8; this zone is highly doped to obtain efficient ohmic contact between the first metal layer and the remaining part of the base;

j) the creation of the highly doped N type emitter zone 9 by ion implantation;

k) the creation of the P doped intrinsic base 10 by ion implantation;

l) the creation of resistors by ion implantation; following these four operations of ion implantation, a diffusion of dopants is done in the epitaxial layer;

m) the deposition of metal layers 11; these layers enable the connection of the components of the integrated circuit with one another;

n) the deposition of a passivation layer to protect the integrated circuit.

In considering the different steps of this method of manufacture, it is seen that the doping operations are done either by pre-deposition or by ion implantation. The technique of pre-deposition is the older of the two doping techniques and enables a controlled introduction of dopants into the substrate. However, ion implantation provides for even more precise control of the dose and depth of penetration of the dopants implanted in the substrate.

However, there remains a step of pre-deposition to make the extrinsic base of the NPN transistors. The extrinsic base is an active zone of the NPN transistor and, in this respect, can withstand only a very small rate of defects in its structure. When the substrate or the epitaxial layer is subjected to ion implantation, the crystal lattice is damaged due to atomic collision and becomes amorphous. The defects of the crystal lattice are then very often amplified during the oxidation that follows the step for the diffusion of the dopants of the extrinsic base.

These defects may then lead to electrical problems, especially problems with respect to the base emitter and base-collector breakdown voltages of the NPN transistor.

The step of making the extrinsic base (step h) is therefore generally done by pre-deposition to avoid these electrical problems. This step comprises the following operations:

a thin LOCOS oxide growth to protect the active zones of all the components of the wafer; these active zones are for example the extrinsic base of an NPN transistor, the base of a PNP transistor or the zones provided for implanted resistors;

a photoetching operation to remove the thin LOCOS oxide on the extrinsic base zones of the NPN transistors; indeed, the doping by boron pre-deposition concerns only the extrinsic base of the NPN transistor;

a pre-deposition of boron using boron nitride wafers on the entire wafer; during the pre-deposition, an oxide layer and a layer of boron glass are formed on the surface of the doped layer; a first operation of corrosion by means of hydrofluoric acid is used to eliminate the oxide layer; an operation of dilution then brings about the growth of a new oxide layer that absorbs the boron glass; a second operation of corrosion with hydrofluoric acid eliminates this second oxide layer;

a difflusion of the dopants in the silicon followed by a second thin LOCOS oxide growth on the surface of the doped zone.

This step for the making of the extrinsic base of the NPN transistor (step h) requires many passages of the wafers in a conventional oven (with oxide growths, pre-deposition, dilution and diffusion) as well as several operations of cleaning and chemical etching (operations of corrosion with hydrofluoric acid) and is consequently very lengthy.

An aim of the invention is to shorten this step of the manufacture of the extrinsic base of an NPN transistor without having to rearrange the other steps of the method of manufacturing the NPN transistor and having a result that is at least equivalent to that of the conventional technique.

SUMMARY OF THE INVENTION

To this end, according to the invention, there is implemented a method for the manufacture of the extrinsic base of an NPN transistor using a high frequency bipolar technology comprising a step of doping by ion implantation.

More specifically, an object of the invention is a method for the manufacture of the extrinsic base of an NPN transistor using a high-frequency bipolar technology. This method of manufacture includes defining, by photoetching, a zone reserved for the extrinsic base on an epitaxial layer, introducing dopants into the zone by ion implantation, performing a first very high-speed thermal annealing operation to recrystallize said implanted zone, and performing a second thermal annealing operation in a conventional oven for the diffusion of the dopants in the epitaxial layer followed by a surface oxidation of the zone.

The temperature and time of the first thermal annealing operation are chosen to avoid any diffusion of the dopants in the epitaxial layer.

The first thermal annealing operation is carried out by effecting a very high-speed rise to a temperature of approximately 1100° C. to 1200° C. and holding the temperature at this level for a period of less than 30 seconds.

Preferably, the temperature is held at 1100° C. to 1200° C. for less than 15 seconds.

Unlike the second thermal annealing operation performed in a conventional oven in which it is possible to simultaneously process a large number of integrated circuit wafers, the first thermal annealing operation is done in a smaller-sized oven enabling a faster and higher rise in temperature.

BRIEF DESCRIPTION OF THE DRAWINGS

Other features and advantages of the invention shall appear from the following description, made with reference to the appended drawings of which:

FIG. 1 is a sectional drawing of an NPN transistor formed by a prior art method of manufacture;

FIG. 2a is a sectional drawing of a state of an extrinsic base of a transistor during manufacture according to an embodiment of the present invention;

FIG. 2b is a sectional drawing of a state of an extrinsic base of a transistor during manufacture according to an embodiment of the present invention; and FIG. 2c is a sectional drawing of a state of an extrinsic base of a transistor during manufacture according to an embodiment of the present invention.

DETAILED DESCRIPTION

FIG. 2a gives a schematic sectional view of a state corresponding to the end of step g) which includes defining active zones through etching, as discussed above in reference to FIG. 1.

At this stage of the manufacturing method, the transistor comprises, in a P type substrate 1, a highly doped N type buried layer 2 on which a slightly doped N type epitaxial layer 3 has been made to grow. A thick oxide layer 4 partially covers the surface of the epitaxial layer 3. This thick oxide layer 4 may be, for example, obtained by the heating of the wafer in a conventional oven in the presence of steam. Anti-channel diffusion zones 6 under thick oxide 4 enables the insulation of the transistor from the other components of the wafer. The transistor also has a collector well 5 which is a highly doped N type zone located in the epitaxial layer 3.

Furthermore, a thin oxide film 12 as well as a silicon nitride layer 13 overlap the epitaxial layer 3 between the thick oxide zones 4. During the step g), the nitride layer 13 is partially removed to enable access to and/or to enable the definition of the active zones of the transistor.

FIGS. 2b and 2c are schematic sectional views giving a more particular view of the states, during manufacture, of the extrinsic base of a transistor according to an embodiment of the present invention.

The method includes a photoetching step and a doping step illustrated in FIG. 2b. During this step, a layer 14 of photosensitive resin is deposited on the upper surface of the wafer. This layer is then exposed to ultraviolet radiation through a mask to irradiate the resin covering the zone reserved for the extrinsic base of the transistor. The irradiated resin whose structure has been modified by the radiation is then removed. The mask used for this step is the mask used in the method of the prior art for the photoetching of the thin LOCOS oxide. The method according to the invention therefore does not necessitate any additional mask.

The next step includes doping by ion implantation during which the wafer is subjected to a beam of boron ions for the doping, through the oxide 12, of the zone reserved for the extrinsic base of the NPN transistor.

In practice, the doping of the extrinsic base requires the implantation of $3 \times 10^{15}$ boron (B) ions per square centimeter with implantation energy of approximately 15 Kev. For an implantation of boron bifluorine (BF2) ions, the energy needed is about 55 Kev.

The wafer then undergoes a first very high-speed thermal annealing operation leading to an at least partial recrystallization of the implanted zone. This recrystallization cannot be seen in the drawing of FIG. 2b for it is done at a speed that is high enough for the dopants not to be diffused in the epitaxial layer 3. This step is of vital importance in the method according to the invention. The first rapid thermal annealing operation is done in a rapid thermal annealing (RTA) type of oven enabling a very high and very fast rise in temperature. To recrystallize the implanted zone, the maximum thermal annealing temperature is set at between 1100° C. and 1200° C., and this temperature is maintained for a period of less than 30 seconds. In practice, the integrated circuit wafers are processed individually in the RTA oven. The annealing time and temperature are a function of the dose and energy of the ion implantation. Preferably, this duration is smaller than fifteen seconds to avoid any risk of diffusion before recrystallization.

The wafer then undergoes a second thermal annealing operation to enable the diffusion of the dopants implanted in the epitaxial layer 3. During this step, illustrated in FIG. 2c, the dopants of the collector well 5 and the anti-channel diffusion zones 6 also get diffused in the epitaxial layer 3 to respectively reach the buried layer 2 and the substrate 1.

This step is followed by an oxidation step in which a thin LOCOS oxide 15 is made to grow on the surface of the newly implanted zones.

Through this method, all the electrical junctions of the NPN transistors are made, in the technology concerned, by ion implantation. Consequently, through the advantages of ion implantation, it is possible to obtain better control of the current gains of the NPN transistors. Also, it is possible to obtain an increase in the diameter of the silicon wafers on which the integrated circuits are made.

Furthermore, all the steps for the manufacture of the extrinsic base of an NPN transistor have been designed so that it is not necessary to rearrange the other steps of the method of manufacturing an NPN transistor. To this end, the step for the diffusion of the dopants of the extrinsic base of the method according to an embodiment of the present invention has not been modified, and therefore, the depth of difflusion of all the doped zones of the transistor has not been changed.

The method according to the invention enables the elimination of a step of thin LOCOS oxide growth. The elimination of this step may prove to be an advantage for the making of washed emitter NPN transistors. A washed emitter transistor is a standard NPN transistor in which the size of the emitter zone is reduced. Consequently, its current gain is smaller than the gain in current of a conventional transistor.

This type of transistor cannot always be made in certain technologies, especially technologies obtained by the reduction of the dimensions dictated by the drafting rules of a parent technology.

During an operation of oxide growth, the oxide layer grows vertically and horizontally. In the method using pre-deposition, there are two growths of thin LOCOS oxide on the surface of the extrinsic base which tend to reduce the implantation surface of the emitter zone 9.

Consequently, the elimination of a step of thin LOCOS growth increases the surface of implantation of the emitter of the NPN transistors and consequently increases their current gain, especially that of the washed emitter contact transistor. The increase in the current gain of this transistor makes it possible to envisage an optical reduction of the dimensions dictated by the drafting rules for all the types of integrated circuit of the technology concerned.

Furthermore, an analysis of a cross-section of an integrated circuit wafer by the chemical development of the doping zones and of the silicon-oxide interfaces makes it possible to note the disappearance of the beak-shaped ends of the thin LOCOS oxide layer. This beaked pattern is typical of the methods comprising two thin LOCOS oxidation steps. This absence of pattern is entirely due to the elimination of a thin LOCOS oxidation step in the method of manufacture of the transistor. This analysis may be performed with a scanning electron microscope.

Although a description has been given of a method relating to the manufacture of the extrinsic base of an NPN transistor, this method could be adapted to the manufacture of any other active zone of an integrated circuit.

Having thus described at least one illustrative embodiment of the invention, various alterations, modifications and improvements will readily occur to those skilled in the art. Such alterations, modifications and improvements are intended to be within the spirit and scope of the invention. Accordingly, the foregoing description is by way of example only and is not intended as limiting. The invention is limited only as defined in the following claims and the equivalents thereto.

What is claimed is:

1. A method for the manufacture of an extrinsic base of an NPN transistor using a high-frequency bipolar technology, comprising the following steps:

the defining, by photetching, of a zone reserved for the extrinsic base on an epitaxial layer;

the introduction of dopants into said zone by ion implantation;

the performance of a first very high-speed thermal annealing operation to recrystallize said implanted zone; and the performance of a second thermal annealing operation in a conventional oven for the diffusion of the dopants in the epitaxial layer followed by a surface oxidation of said zone.

2. A method according to claim 1, wherein the first thermal annealing operation is done by a very fast rise to a temperature of 1100°C. to 1200° C. approximately, and the holding of the temperature at this level for a period of less than 30 seconds.

3. A method according to claim 2, wherein the temperature is held at 1100°C. to 1200° C. for less than 15 seconds.

* * * * *